(12) United States Patent
Curatola et al.

(10) Patent No.: US 9,825,139 B2
(45) Date of Patent: Nov. 21, 2017

(54) SEMICONDUCTOR DEVICE AND METHOD

(71) Applicant: Infineon Technologies Austria AG, Villach (AT)

(72) Inventors: Gilberto Curatola, Villach (AT); Oliver Haeberlen, St. Magdalen (AT); Simone Lavanga, Villach (AT); Gianmauro Pozzovivo, Villach (AT); Fabian Reiher, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/402,581

(22) Filed: Jan. 10, 2017

(65) Prior Publication Data

US 2017/0148883 A1 May 25, 2017

Related U.S. Application Data

(63) Continuation of application No. 14/723,954, filed on May 28, 2015, now Pat. No. 9,564,524.

(30) Foreign Application Priority Data

May 28, 2014 (DE) ......................... 10 2014 107 560

(51) Int. Cl.
*H01L 29/15* (2006.01)
*H01L 29/40* (2006.01)
(Continued)

(52) U.S. Cl.
CPC .......... *H01L 29/408* (2013.01); *H01L 21/308* (2013.01); *H01L 21/30612* (2013.01); *H01L 21/31111* (2013.01); *H01L 21/31144* (2013.01); *H01L 23/4824* (2013.01); *H01L 29/2003* (2013.01); *H01L 29/205* (2013.01); *H01L 29/66462* (2013.01); *H01L 29/7787* (2013.01)

(58) Field of Classification Search
CPC ............. H01L 21/30612; H01L 21/308; H01L 21/31111; H01L 21/31144; H01L 23/4824; H01L 29/2003; H01L 29/205; H01L 29/408; H01L 29/66462; H01L 29/7787
See application file for complete search history.

(56) References Cited

U.S. PATENT DOCUMENTS 5,976,904 A  11/1999  Gotoh et al.
7,152,804 B1  12/2006  MacKenzie et al.
(Continued)

OTHER PUBLICATIONS

Notice of Allowance, dated Sep. 28, 2016 for U.S. Appl. No. 14/723,954.
(Continued)

*Primary Examiner* — Yosef Gebreyesus
(74) *Attorney, Agent, or Firm* — Eschweiler & Potashnik, LLC

(57) ABSTRACT

A semiconductor device includes a device region including a compound semiconductor material and a non-device region at least partially surrounding the device region. The semiconductor device further includes a dielectric material in the non-device region and at least one electrode in the device region. The semiconductor device further includes at least one pad electrically coupled to the at least one electrode, wherein the at least one pad is arranged on the dielectric material in the non-device region.

20 Claims, 11 Drawing Sheets

(51) Int. Cl.

| | | |
|---|---|---|
| *H01L 29/778* | (2006.01) | |
| *H01L 23/482* | (2006.01) | |
| *H01L 29/20* | (2006.01) | |
| *H01L 29/205* | (2006.01) | |
| *H01L 29/66* | (2006.01) | |
| *H01L 21/311* | (2006.01) | |
| *H01L 21/306* | (2006.01) | |
| *H01L 21/308* | (2006.01) | |

(56) References Cited

U.S. PATENT DOCUMENTS

| | | | |
|---|---|---|---|
| 2006/0131620 A1* | 6/2006 | Alm | .............. H01L 23/481 257/276 |
| 2007/0051977 A1 | 3/2007 | Saito et al. | |
| 2008/0210977 A1 | 9/2008 | Okita | |
| 2011/0057235 A1 | 3/2011 | Shim | |
| 2011/0140172 A1 | 6/2011 | Chu et al. | |
| 2011/0272748 A1* | 11/2011 | Kimura | ............... H01L 23/4824 257/279 |
| 2013/0256754 A1 | 10/2013 | Kamada | |
| 2014/0042458 A1 | 2/2014 | Bahl et al. | |

OTHER PUBLICATIONS

Non-Final Office Action, dated May 20, 2016 for U.S. Appl. No. 14/723,954.

\* cited by examiner

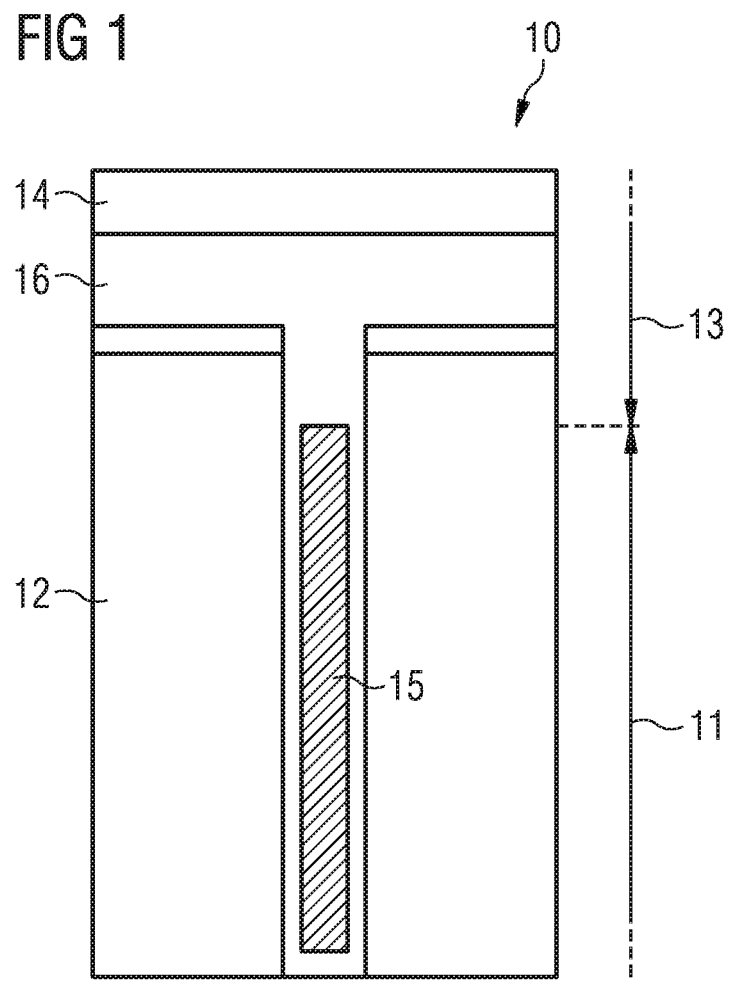

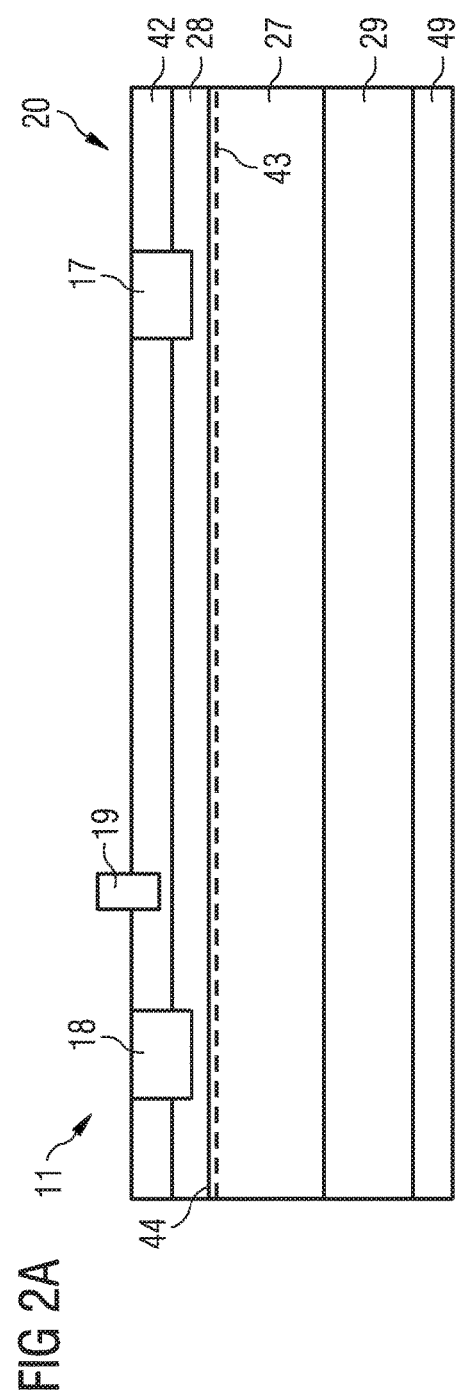
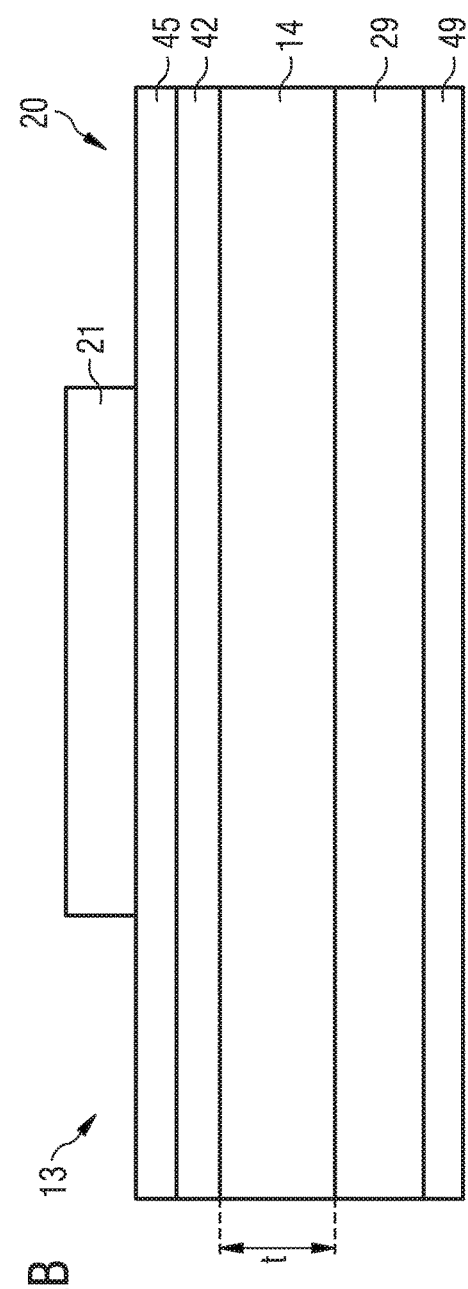

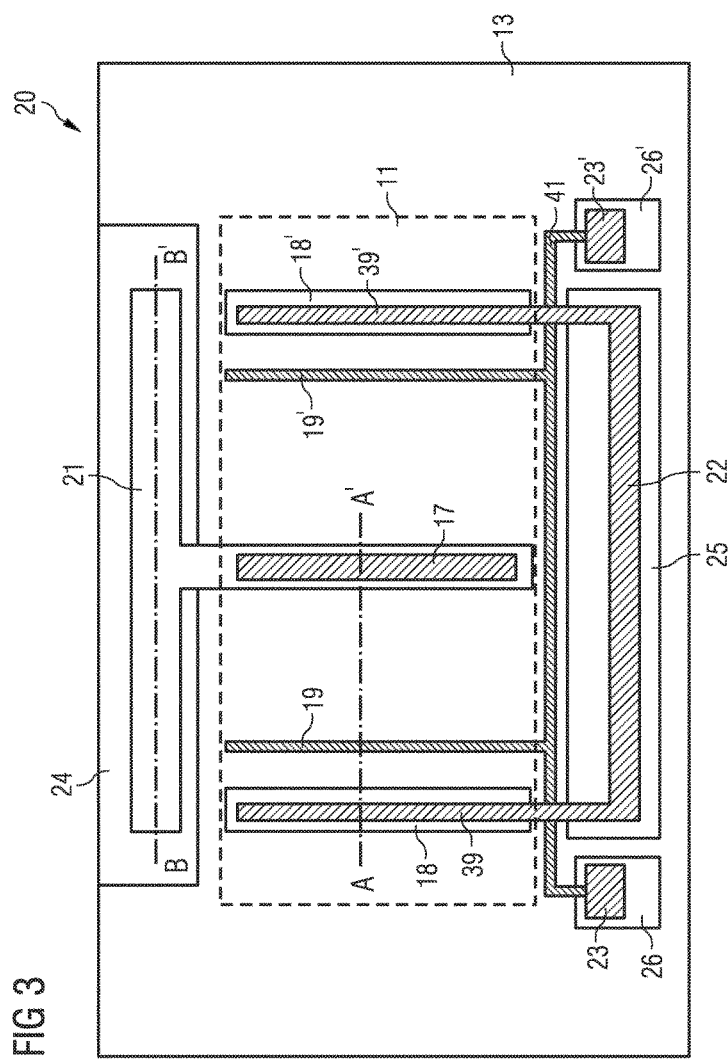

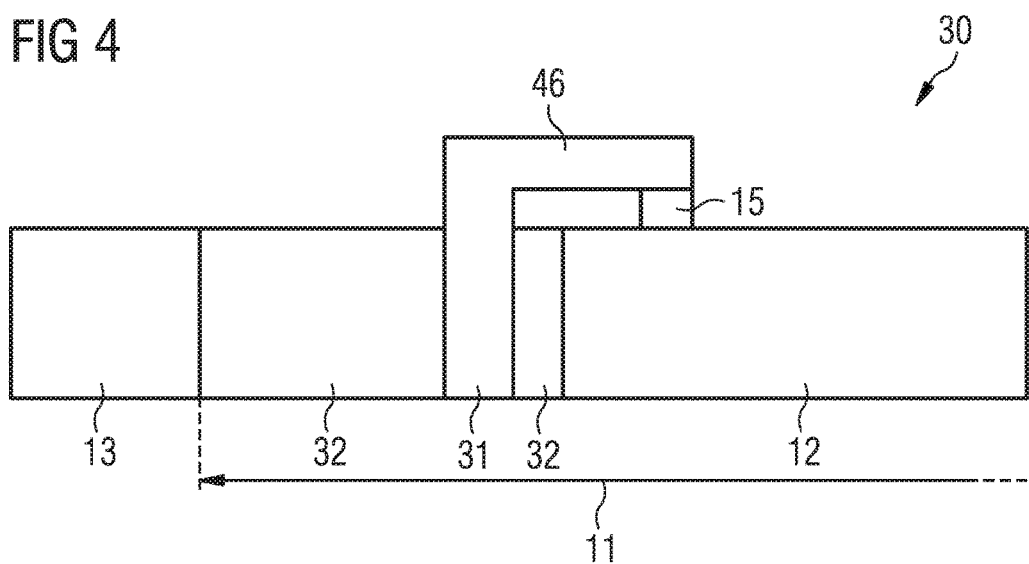

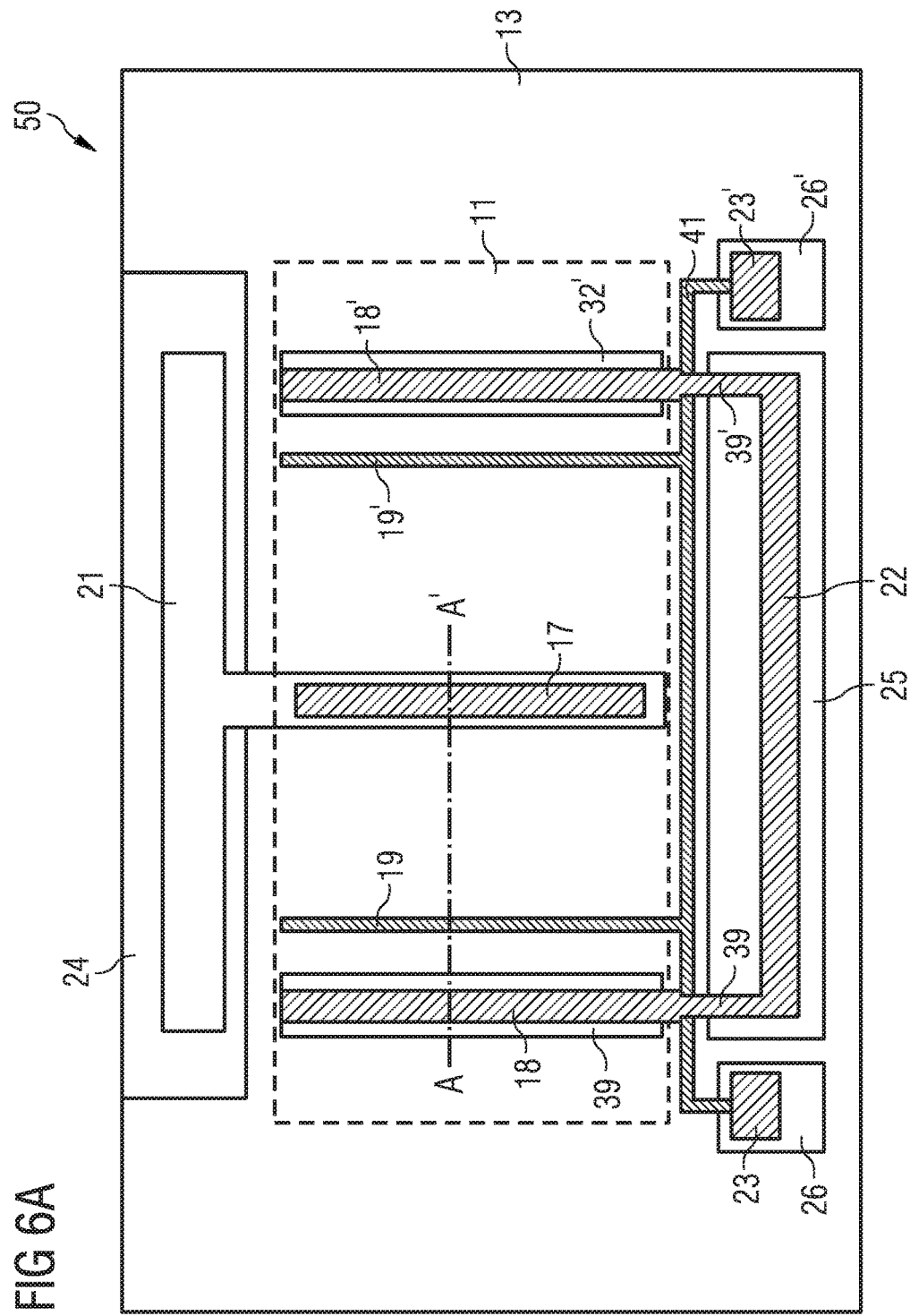

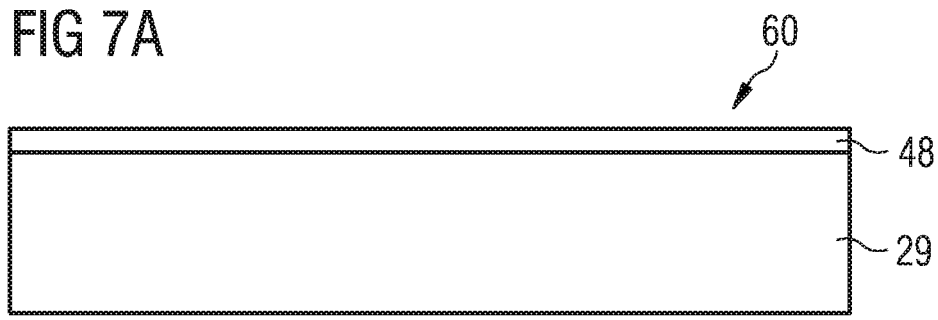
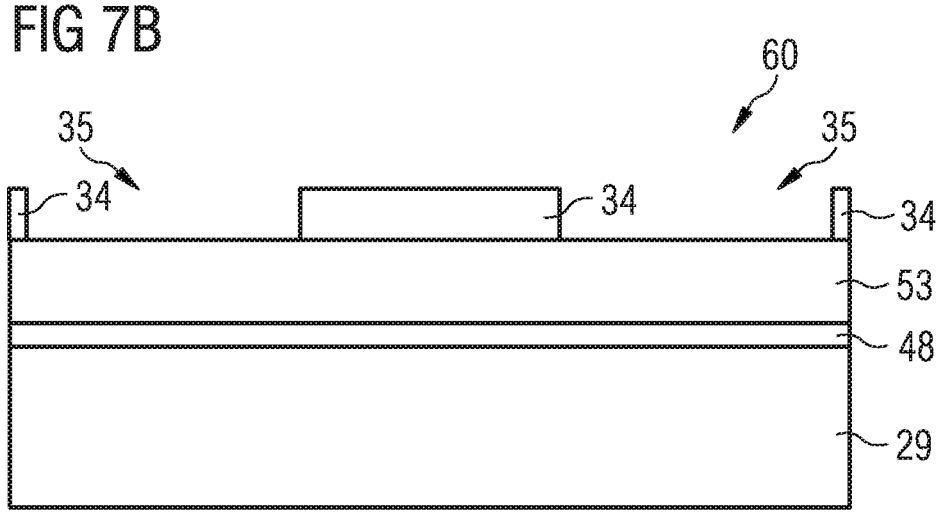
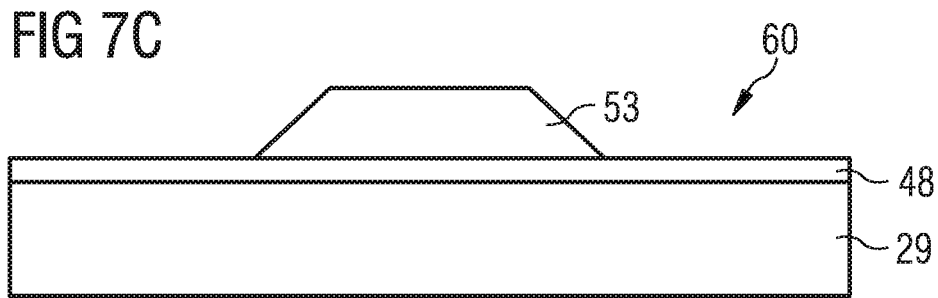

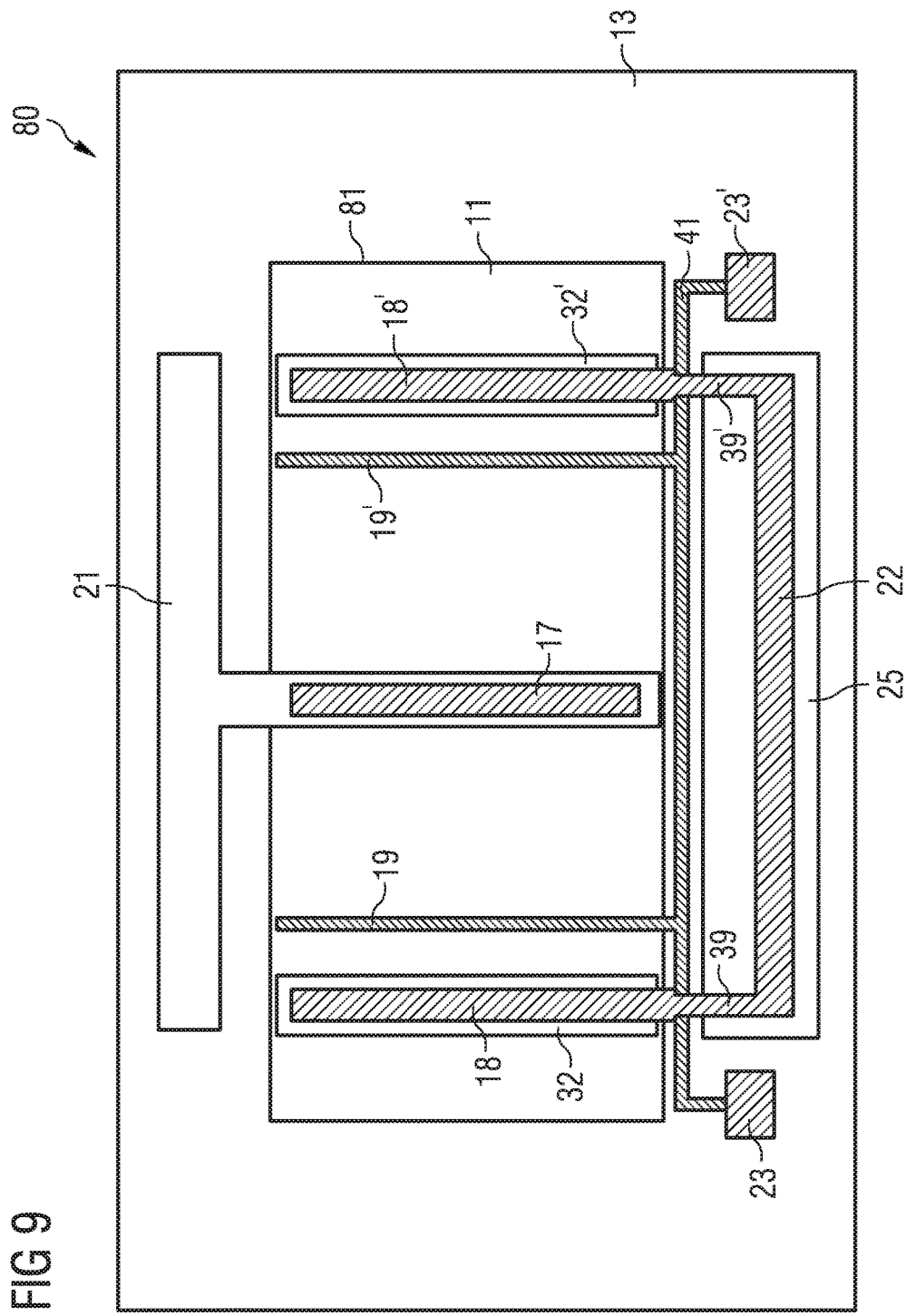

SEMICONDUCTOR DEVICE AND METHOD

CROSS REFERENCE TO RELATED APPLICATION

This application is a continuation of U.S. application Ser. No. 14/723,954 filed on May 28, 2015, which claims priority to German Patent Application number 102 014 107 560.9 filed on May 28, 2014 and is hereby incorporated in its entirety.

FIELD

Semiconductor devices may be based on different semiconductor materials, for example, silicon, gallium-arsenide and group III-nitrides. A group III-nitride-based semiconductor device, in which gallium nitride is used as part of the semiconductor materials, has a larger bandgap and a higher critical field compared to the semiconductor device which uses silicon as the main material.

By way of example, a group III-nitride-based semiconductor device may include an aluminium gallium nitride/gallium nitride heterostructure field effect transistor or a high electron mobility transistor (HEMT). Such devices may be formed by depositing layers of appropriate composition and thickness epitaxially on a substrate such as a silicon substrate.

A group III-nitride-based semiconductor device may provide a semiconductor device having a low on-resistance and low loss. Such semiconductor devices may be useful for power control, for example. Reducing the device output capacitance may be desirable.

DESCRIPTION OF INVENTION

According to an embodiment of a semiconductor device, the semiconductor device includes a device region including a compound semiconductor material and a non-device region at least partially surrounding the device region. The semiconductor device further includes a dielectric material in the non-device region and at least one electrode in the device region. The semiconductor device further includes at least one pad electrically coupled to the at least one electrode, wherein the at least one pad is arranged on the dielectric material in the non-device region.

According to another embodiment of a semiconductor device, the semiconductor device includes a device region including a compound semiconductor material and a non-device region at least partially surrounding the device region. The semiconductor device further includes at least one electrode in the device region and an electrically conductive material in the device region being electrically coupled to the at least one electrode. The semiconductor device further includes a dielectric material in the device region, wherein the dielectric material at least partially surrounds the electrically conductive material.

According to an embodiment of a method of producing a semiconductor device, the method includes: forming a device region including a compound semiconductor material; forming a non-device region at least partially surrounding the device region; providing a dielectric material in the non-device region; forming at least one electrode in the device region; and forming at least one pad electrically coupled to the at least one electrode, wherein the at least one pad is formed on the dielectric material in the non-device region.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. In the drawings, the thicknesses of layers and regions may be exaggerated for clarity. Like reference numerals designate corresponding similar parts. The features of the various illustrated embodiments can be combined unless they exclude each other. Embodiments are depicted in the drawings and are detailed in the description which follows. In the drawings:

FIG. 1 illustrates a top view of a semiconductor device according to a first embodiment;

FIG. 2A illustrates a schematic view of a first section of a semiconductor device according to a second embodiment;

FIG. 2B illustrates a schematic view of a second section of the semiconductor device illustrated in FIG. 2A;

FIG. 3 illustrates a schematic top view of the semiconductor device illustrated in FIGS. 2A and 2B;

FIG. 4 illustrates a schematic view of a section of a semiconductor device according to a third embodiment;

FIG. 6A illustrates a schematic top view of a semiconductor device according to a fifth embodiment;

FIGS. 7A to 7F illustrate a method of producing a semiconductor device according to a first embodiment;

FIG. 9 illustrates a schematic top view of a semiconductor device according to a sixth embodiment.

DETAILED DESCRIPTION

Figure 5:
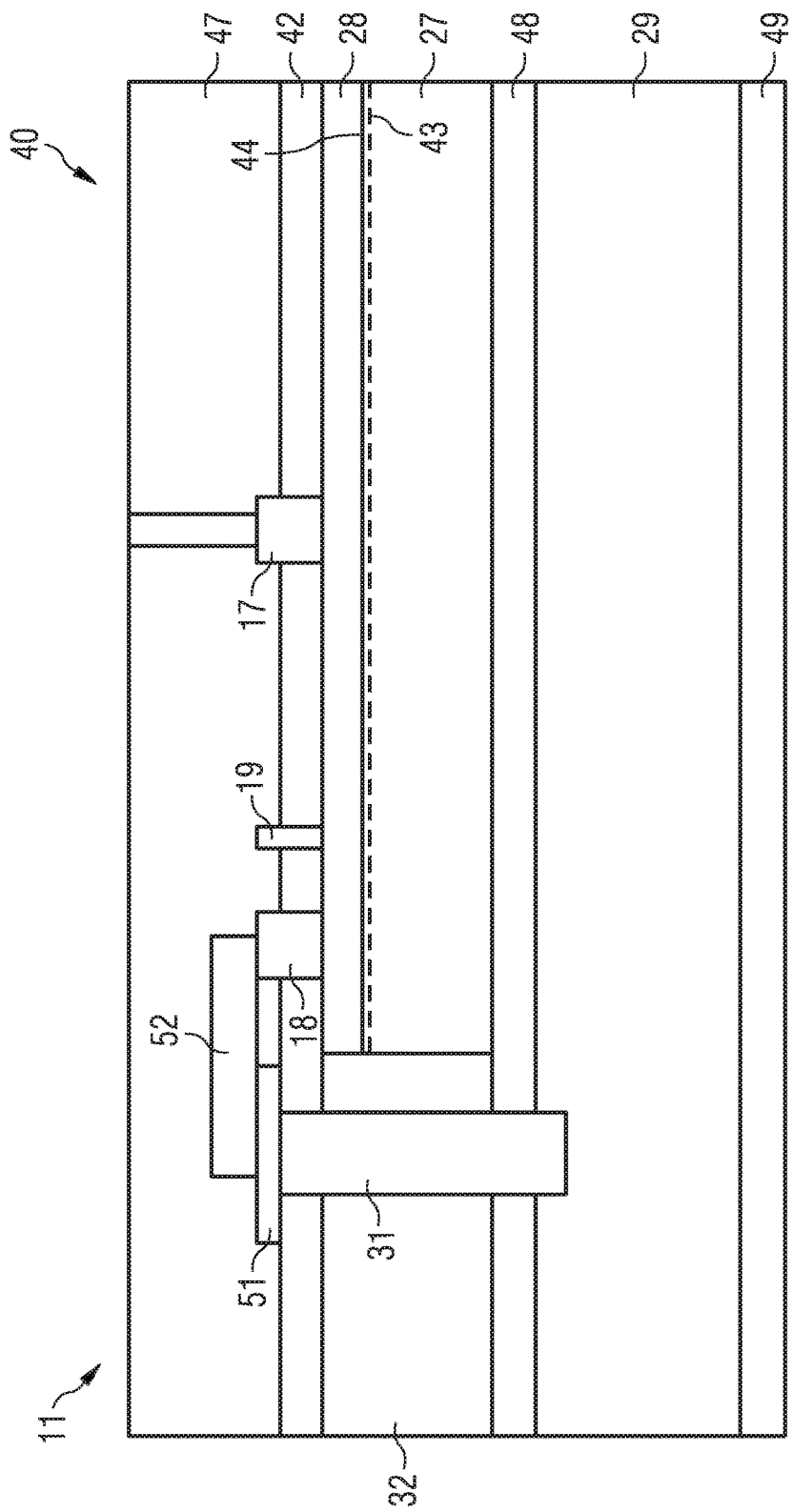
FIG. 5 illustrates a schematic view of a section of a semiconductor device according to a fourth embodiment.

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

It will be understood that, if an element is referred to as being arranged "on" another element or provided "on" another element, it can be arranged directly on the other element or intervening elements may be present. In contrast, if an element is referred to as being arranged "directly on" another element or provided "directly on" another element, there are no intervening elements present.

As employed in this specification, the terms "coupled" and/or "electrically coupled" are not meant to mean that the elements must be directly coupled together, but intervening elements may be provided between the "coupled" or "electrically coupled" elements. However, if an element is referred to as being "directly coupled" and/or "directly electrically coupled" to another element, there are no intervening elements present.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", if used herein, specify the presence of stated features, integers, steps, operations, elements, layers and/or components, but do not preclude the presence or addition of one or more other features, integers, steps, operations, elements, layers, components and/or groups thereof.

Example embodiments are described herein with reference to cross-sectional illustrations that are schematic illustrations of embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and vice versa and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functions/acts involved.

As used herein, a compound semiconductor device may include any suitable semiconductor material that forms a field-effect transistor (FET) such as an insulated-gate FET (IGFET), or a high electron mobility transistor (HEMT), for example. The term HEMT is also commonly referred to as HFET (heterostructure field effect transistor), MODFET (modulation-doped FET) or MESFET (metal semiconductor field effect transistor). The terms compound semiconductor device, HFET, HEMT, MESFET and MODFET are used interchangeably herein to refer to a device incorporating a junction between two materials with different band gaps (i.e. a heterojunction) as the channel. Suitable semiconductor materials include compound semiconductor materials such as SiGe, SiC, and group III-V materials including group III-Arsenide, group III-Phosphide, group III-Nitride or any of their alloys. Therefore, the phrase "group III-V" refers to a compound semiconductor that includes a group V element and at least one group III element. Moreover, the phrase "group III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Group III-Nitride also refers generally to any polarity including but not limited to Ga-polar, N-polar, semi-polar or non-polar crystal orientations.

These semiconductor materials are semiconductor compounds that have a relatively wide, direct bandgap, and have high critical breakdown fields, high saturation drift velocity and good thermal conductivity. As a result, III-Nitride materials such as GaN are used in many microelectronic applications in which high power density and high efficiency switching are required.

Example embodiments relate to semiconductor devices, and more particularly, to high electron mobility transistors (HEMTs) and methods of manufacturing the same.

FIG. 1 illustrates a top view of a semiconductor device 10 according to a first embodiment.

The semiconductor device 10 includes a device region 11 including a compound semiconductor material 12 and a non-device region 13 at least partially surrounding the device region 11. The semiconductor device 10 further includes a dielectric material 14 in the non-device region 13 and at least one electrode 15 in the device region 11. The semiconductor device 10 further includes at least one pad 16 electrically coupled to the at least one electrode 15, wherein the at least one pad 16 is arranged on the dielectric material 14 in the non-device region 13.

The dielectric material 14 may include a dielectric constant lower than a dielectric constant of the compound semiconductor material 12 and may include at least one of silicon oxynitride ($SiO_xN_y$), silicon oxide ($SiO_x$), silicon nitride ($Si_3N_4$), and aluminum oxide ($Al_2O_3$).

A thickness t of the dielectric material 14 in a vertical direction, i.e. in a direction perpendicular to the plane illustrated in FIG. 1, may be in a range of 1 µm≤t≤6 µm.

The semiconductor device 10 may include a first current electrode, a second current electrode and a control electrode in the device region 11 and a first pad electrically coupled to the first current electrode, a second pad electrically coupled to the second current electrode and a third pad electrically coupled to the control electrode, wherein the first pad, the second pad and the third pad each are arranged in the non-device region 13.

The dielectric material 14 may include a first dielectric layer, a second dielectric layer and a third dielectric layer.

The first pad may be arranged on the first dielectric layer, the second pad may be arranged on the second dielectric layer and the third pad may be arranged on the third dielectric layer.

The compound semiconductor material 12 may include a first semiconductor material including a first bandgap and a second semiconductor material including a second bandgap, the second bandgap being different from the first bandgap. The first semiconductor material may include GaN and the second semiconductor material may include AlGaN. The semiconductor device 10 may be a high electron mobility transistor (HEMT).

A method of producing the semiconductor device 10 may include forming the device region 11 including the compound semiconductor material 12; forming the non-device region 13 at least partially surrounding the device region 11; providing the dielectric material 14 in the non-device region 13; forming the at least one electrode 15 in the device region 11; and forming the at least one pad 16 electrically coupled to the at least one electrode 15, wherein the at least one pad 16 is formed on the dielectric material 14 in the non-device region 13.

The dielectric material 14 may be provided by the following steps: providing a substrate; applying the dielectric material 14 on the substrate; forming a structured mask on the dielectric material 14, the structured mask including at least one opening in the device region 11; removing the dielectric material 14 at least partially below the at least one opening; and removing the structured mask. The dielectric material may be removed by etching the dielectric material below the at least one opening.

The dielectric material 14 may further be provided by the following steps: providing a substrate; applying the compound semiconductor material 12 on the substrate; forming a structured mask on the compound semiconductor material 12, the structured mask including at least one opening in the non-device region 13; forming a trench in the compound semiconductor material 12 at least partially below the at least one opening; providing the dielectric material 14 in the trench; and removing the structured mask. The trench may be formed by etching the compound semiconductor material 12 below the at least one opening.

The dielectric material 14 may be thinned in a further process step, wherein a thickness t of the thinned dielectric material 14 in a vertical direction, i.e. in a direction perpendicular to the plane illustrated in FIG. 1, may be in a range of 1 µm≤t≤6 µm.

FIG. 2A illustrates a schematic view of a first section of a semiconductor device 20 taken along the line A-A' illustrated in FIG. 3 according to a second embodiment.

In FIG. 2A, a device region 11 of the semiconductor device 20 is illustrated. The device region 20 provides an active region of the semiconductor device 20. In the device region 11, the semiconductor device 20 includes a first compound semiconductor material 27 and a second compound semiconductor material 28 on the first compound semiconductor material 27. The second compound semiconductor material 28 includes a different material than the first compound semiconductor material 27. The semiconductor device 20 further includes a substrate 29. In the illustrated embodiment, the substrate 29 is electrically conductive. The substrate 29 may include Si or SiGe. The first compound semiconductor material 27 is arranged on the substrate 29.

In the illustrated embodiment, the first compound semiconductor material 27 includes GaN and the second compound semiconductor material 28 includes AlGaN, i.e. an alloy described by the formula $Al_xGa_{(1-x)}N$, where x<1. The first compound semiconductor material 27 thus includes a first bandgap and the second compound semiconductor material 28 includes a second bandgap, the second bandgap being different from the first bandgap so that a heterojunction 44 is formed at the interface between the respective compound semiconductor materials. A two-dimensional electron gas is formed at the heterojunction 44 formed between the first compound semiconductor material 27 and the second compound semiconductor material 28 and is indicated by a dotted line 43 in FIG. 2A. The semiconductor device 20 is thus provided in the form of a gallium nitride-based HEMT (high electron mobility transistor), the first compound semiconductor material 27 providing a channel layer and the second compound semiconductor material 28 providing a barrier layer of the HEMT.

In the illustrated embodiment, both the first compound semiconductor material 27 and the second compound semiconductor material 28 are unintentionally doped. As used herein, the term "unintentionally doped" includes materials (including intrinsic materials) that include dopant atoms, but that are not intentionally or proactively doped. As well understood in the art, a small amount of unintentional doping typically occurs based upon background contamination in whatever apparatus is used to grow or otherwise form the undoped layer. Such materials are also referred to as "intrinsic". With respect to gallium nitride (GaN) and related group III-Nitrides, layers having carrier concentrations of about $1·10^{17}$ cm$^{-3}$ or less are typically considered unintentionally doped. As recognized by those familiar with this art, the terms "unintentionally doped" and "undoped" are often used in interchangeable fashion, and they will be understood in that manner in the this specification. The first compound semiconductor material 27 thus includes a first doping concentration of unintentional doping and the second compound semiconductor material 28 includes a second doping concentration of unintentional doping.

The semiconductor device 20 further includes a control electrode 19 arranged on the second compound semiconductor material 28 and providing a gate electrode of the gallium nitride-based HEMT. The control electrode 19 is configured to control the semiconductor device 20 by applying a suitable voltage to the control electrode 19. The semiconductor device 20 may be a normally-on HEMT or a normally-off HEMT. Moreover, the semiconductor device 20 includes a first current electrode 17 and a second current electrode 18. The first current electrode 17 provides a drain electrode of the gallium nitride-based HEMT and the second current electrode 18 provides a source electrode of the gallium nitride-based HEMT. The first current electrode 17, the second current electrode 18 and the control electrode 19 include an electrically conductive material, for example a metal or highly doped polysilicon.

The semiconductor device 20 further includes a passivation layer 42 arranged on the second compound semiconductor material 28. In the illustrated embodiment, the passivation layer 42 includes $Si_xN_y$. The control electrode 19, the first current electrode 17 and the second current electrode 18 extend through the passivation layer 42 and directly contact the second compound semiconductor material 28.

Moreover, the semiconductor device 20 includes a metallization layer 49. The metallization layer 49 is arranged on a back-sided surface of the substrate 29 opposite a surface on which the first compound semiconductor material 27 is arranged in the device region 11. The metallization layer 49 is electrically coupled to the second current electrode 18 via an electrically conductive path (not illustrated) and provides a backside contact area.

FIG. 2B illustrates a schematic view of a second section of the semiconductor device 20 taken along the line B-B' illustrated in FIG. 3.

In FIG. 2B, a non-device region 13 of the semiconductor device 20 is illustrated. The non-device region 13 provides an edge region of the semiconductor device 20 and at least partially surrounds the device region 11 of the semiconductor device 20 illustrated in FIG. 2A. In the non-device region 13, the semiconductor device 20 includes a dielectric material 14 arranged on the substrate 29. In the illustrated embodiment, the dielectric material 14 includes silicon dioxide ($SiO_2$). A thickness t of the dielectric material 14 in a vertical direction of the semiconductor device 20 may be in a range of 1 µm≤t≤6 µm.

The passivation layer 42 which is arranged on the second compound semiconductor material 28 in the device region 11 as illustrated in FIG. 2A is further arranged on the dielectric material 14 in the non-device region 13. The metallization layer 49 which is arranged on the back-sided surface of the substrate 29 in the device region 11 as illustrated in FIG. 2A is further arranged on the back-sided surface of the substrate 29 opposite a surface on which the dielectric material 14 is arranged in the non-device region 13.

In the non-device region 13, the semiconductor device 20 includes a further passivation layer 45 arranged on the passivation layer 42. In the illustrated embodiment, the passivation layer 45 includes silicon oxide ($SiO_x$). A first pad 21 is arranged on the passivation layer 45. The first pad 21 includes an electrically conductive material, for example a metal.

As illustrated in FIGS. 2A and 2B, the first compound semiconductor material 27 and the second compound semiconductor material 28 are arranged only in the device region 11 of the semiconductor device 20, i.e. the first compound semiconductor material 27 and the second compound semiconductor material 28 are not arranged in the non-device region 13. Thus, the non-device region 13 is free from the compound semiconductor material.

FIG. 3 illustrates a schematic top view of a section of the semiconductor device 20 illustrated in FIGS. 2A and 2B. For reasons of clarity, the passivation layer 42 and the passivation layer 45 illustrated in FIGS. 2A and 2B, respectively, are omitted in FIG. 3. A dashed line schematically illustrates a separation between the device region 11 and the non-device region 13 of the semiconductor device 20.

As illustrated in FIG. 3, the first pad 21 is electrically coupled to the first current electrode 17. Moreover, the semiconductor device 20 includes a second pad 22 electrically coupled to the second current electrode 18 via an electrically conductive path 39 and a third pad 23 electrically coupled to the control electrode 19 via an electrically conductive path 41. In the illustrated embodiment, the semiconductor device 20 includes a further current electrode 18' providing a source electrode of the gallium nitride-based HEMT and being electrically coupled to the second pad 22 via an electrically conductive path 39' and a further control electrode 19' providing a gate electrode of the gallium nitride-based HEMT and being electrically coupled to a fourth pad 23' via the electrically conductive path 41. The current electrode 18' and the control electrode 19' are arranged in the device region 11. The first pad 21, the second pad 22, the third pad 23 and the fourth pad 23' are arranged in the non-device region 13 and provide contact areas for electrical connections (not illustrated) of the semiconductor device 20.

Moreover, the semiconductor device 20 includes a first dielectric layer 24, a second dielectric layer 25, a third dielectric layer 26 and a fourth dielectric layer 26' each including the dielectric material 14 illustrated in FIG. 2B. In the illustrated embodiment, the first pad 21 is arranged on the first dielectric layer 24, the second pad 22 is arranged on the second dielectric layer 25, the third pad 23 is arranged on the third dielectric layer 26 and the fourth pad 23' is arranged on the fourth dielectric layer 26'.

In further embodiments, at least one of the first pad 21, the second pad 22, the third pad 23 and the fourth pad 23' is arranged on the dielectric material in the non-device region 13. For example, only one of said pads may be arranged on the dielectric material in the non-device region 13 or two of said pads may be arranged on the dielectric material in the non-device region 13.

By arranging at least one of the pads 21, 22, 23 and 23' on the dielectric material in the non-device region 13, an influence of the electrically conductive substrate on the overall device performance of the HEMT may be reduced by reducing an impact of the backside metallization layer 49 especially on the device output capacitance. Moreover, by providing the first compound semiconductor material 27 and the second compound semiconductor material 28 only in the device region 11 of the semiconductor device 20, i.e. only in the active areas of the device, a significant decrease in parasitic capacitances coming from the pads 21, 22, 23 and 23' arranged in the non-device region 13 may be provided. In the illustrated embodiment, a parasitic gate-to-source capacitance and a parasitic drain-to-source capacitance may be reduced to be typically about three times lower than without providing the dielectric material in the non-device region 13.

FIG. 4 illustrates a schematic view of a section of a semiconductor device 30 according to a third embodiment.

The semiconductor device 30 includes a device region 11 including a compound semiconductor material 12 and a non-device region 13 at least partially surrounding the device region 11. The semiconductor device 30 further includes at least one electrode 15 in the device region 11 and an electrically conductive material 31 in the device region 11 being electrically coupled to the at least one electrode 15 via an electrically conductive path 46. The semiconductor device 30 further includes a dielectric material 32 in the device region 11. The dielectric material 32 at least partially surrounds the electrically conductive material 31.

The dielectric material 14 may include a dielectric constant lower than a dielectric constant of the compound semiconductor material 12 and may include at least one of silicon oxynitride ($SiO_xN_y$), silicon oxide ($SiO_x$), silicon nitride ($Si_3N_4$), and aluminum oxide ($Al_2O_3$).

The compound semiconductor material 12 may include a first semiconductor material including a first bandgap and a second semiconductor material including a second bandgap, the second bandgap being different from the first bandgap. The first semiconductor material may include GaN and the second semiconductor material may include AlGaN. The semiconductor device 30 may be a high electron mobility transistor (HEMT).

The semiconductor device 30 may further include at least one pad arranged in the non-device region 13 and a substrate. The electrically conductive material 31 may be electrically coupled to the at least one pad and may extend to the substrate.

FIG. 5 illustrates a schematic view of a section of a semiconductor device 40 according to a fourth embodiment.

In FIG. 5, a device region 11 of the semiconductor device 40 is illustrated. In the device region 11, the semiconductor device 40 includes a first compound semiconductor material 27 and a second compound semiconductor material 28 on the first compound semiconductor material 27. The second compound semiconductor material 28 includes a different material than the first compound semiconductor material 27. The semiconductor device 40 further includes a substrate 29 and a buffer layer 48 arranged on the substrate 29. In the illustrated embodiment, the substrate 29 is electrically conductive and may include Si or SiGe. The buffer layer 48 includes aluminum nitride (AlN). The first compound semiconductor material 27 is arranged on the buffer layer 48.

In the illustrated embodiment, the first compound semiconductor material 27 includes GaN and the second compound semiconductor material 28 includes AlGaN, i.e. an alloy described by the formula $Al_xGa_{(1-x)}N$, where x<1. A two-dimensional electron gas is formed at the heterojunction 44 formed between the first compound semiconductor material 27 and the second compound semiconductor material 28 and is indicated by a dotted line 43 in FIG. 5. The semiconductor device 40 is thus provided in the form of a gallium nitride-based HEMT, the first compound semiconductor material 27 providing a channel layer and the second compound semiconductor material 28 providing a barrier layer of the HEMT. In the illustrated embodiment, both the first compound semiconductor material 27 and the second compound semiconductor material 28 are unintentionally doped.

The semiconductor device 40 further includes a control electrode 19 arranged on the second compound semiconductor material 28 and providing a gate electrode of the gallium nitride-based HEMT. The control electrode 19 is configured to control the semiconductor device 20 by applying a suitable voltage to the control electrode 19. The semiconductor device 40 may be a normally-on HEMT or a normally-off HEMT. Moreover, the semiconductor device 40 includes a first current electrode 17 and a second current electrode 18. The first current electrode 17 provides a drain electrode of the gallium nitride-based HEMT and the second current electrode 18 provides a source electrode of the gallium nitride-based HEMT. The first current electrode 17, the second current electrode 18 and the control electrode 19 include an electrically conductive material, for example a metal or highly doped polysilicon.

The semiconductor device 40 further includes a passivation layer 42 arranged on the second compound semiconductor material 28 and an interlayer dielectric 47 arranged on the passivation layer 42. In the illustrated embodiment, the passivation layer 42 includes $Si_xN_y$. The control electrode 19, the first current electrode 17 and the second current electrode 18 extend through the passivation layer 42 and directly contact the second compound semiconductor material 28.

Moreover, the semiconductor device 40 includes an electrically conductive material 31 in the device region 11. In the illustrated embodiment, the electrically conductive material 31 is electrically coupled to the second current electrode 18 via a first electrically conductive layer 51 and a second electrically conductive layer 52 arranged in the interlayer dielectric 47. The electrically conductive material 31, the first electrically conductive layer 51 and the second electrically conductive layer 52 may include a metal or highly doped polysilicon. The semiconductor device 40 further includes a dielectric material 32 in the device region 11. In the illustrated embodiment, the dielectric material 32 includes silicon dioxide ($SiO_2$). The dielectric material 32 at least partially surrounds the electrically conductive material 31. The electrically conductive material 31 extends in a vertical direction from the first electrically conductive layer 51 through the passivation layer 42, the dielectric material 32 and the buffer layer 48 into the electrically conductive substrate 29.

The semiconductor device 40 further includes a metallization layer 49. The metallization layer 49 is arranged on a back-sided surface of the substrate 29 opposite a surface on which the buffer layer 48 is arranged. The metallization layer 49 is electrically coupled to the second current electrode 18 via the electrically conductive substrate 29, the electrically conductive material 31, the first electrically conductive layer 51 and the second electrically conductive layer 52 and provides a backside contact area.

By providing the electrically conductive material 31 extending into the electrically conductive substrate 29, a quasi vertical HEMT may be produced. In the illustrated embodiment, a vertical source connection from a backsided surface to a frontsided surface of the semiconductor device 40 is thereby provided. In further embodiments, a vertical drain connection from a backsided surface to a frontsided surface may be provided.

Figure 6B:
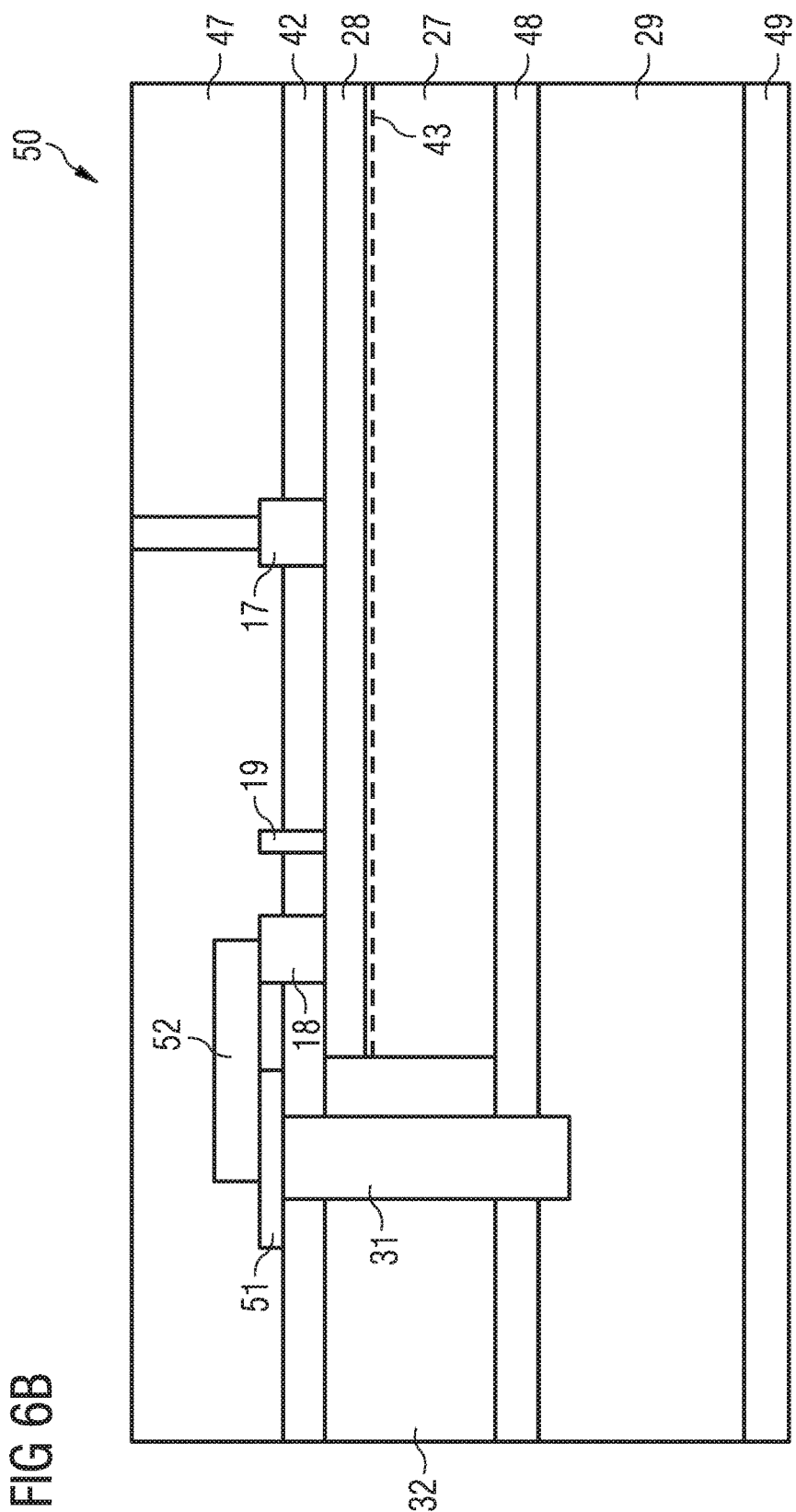
FIG. 6B illustrates a schematic view of a section of the semiconductor device illustrated in FIG. 6A.

The embodiments illustrated in FIGS. 1 to 5 may also be combined, thereby providing a low parasitic vertical semiconductor device, as illustrated in FIGS. 6A and 6B.

FIG. 6A illustrates a schematic top view of a section of a semiconductor device 50 according to a fifth embodiment. A dashed line schematically illustrates a separation between the device region 11 and the non-device region 13 of the semiconductor device 50.

As illustrated in FIG. 6A, the semiconductor device 50 includes a first pad 21 electrically coupled to a first current electrode 17. Moreover, the semiconductor device 50 includes a second pad 22 electrically coupled to a second current electrode 18 via an electrically conductive path 39 and a third pad 23 electrically coupled to a control electrode 19 via an electrically conductive path 41. The first current electrode 17 provides a drain electrode of the semiconductor device 50 and the second current electrode 18 provides a source electrode of the semiconductor device 50. The first current electrode 17, the second current electrode 18, the control electrode 19, the first pad 21, the second pad 22 and the third pad 23 include an electrically conductive material, for example a metal or highly doped polysilicon.

In the illustrated embodiment, the semiconductor device 50 includes a further current electrode 18' providing a source electrode of the semiconductor device 50 and being electrically coupled to the second pad 22 via an electrically conductive path 39' and a further control electrode 19' providing a gate electrode of the semiconductor device 50 and being electrically coupled to a fourth pad 23' via the electrically conductive path 41. The current electrode 18' and the control electrode 19' are arranged in the device region 11. The first pad 21, the second pad 22, the third pad 23 and the fourth pad 23' are arranged in the non-device region 13 and provide contact areas for electrical connections (not illustrated) of the semiconductor device 50.

Moreover, the semiconductor device 50 includes a first dielectric layer 24, a second dielectric layer 25, a third dielectric layer 26 and a fourth dielectric layer 26' each including a dielectric material. In the illustrated embodiment, the dielectric material includes silicon dioxide ($SiO_2$). The first pad 21 is arranged on the first dielectric layer 24, the second pad 22 is arranged on the second dielectric layer 25, the third pad 23 is arranged on the third dielectric layer 26 and the fourth pad 23' is arranged on the fourth dielectric layer 26'. The semiconductor device 50 further includes a dielectric material 32 in the device region 11 as explained in detail with reference to FIG. 6B.

FIG. 6B illustrates a schematic view of a section of the semiconductor device 50 taken along the line A-A' illustrated in FIG. 6A.

As illustrated in FIG. 6B, the semiconductor device 50 includes an electrically conductive material 31 and the dielectric material 32 illustrated in FIG. 6A in the device region 11. In the illustrated embodiment, the electrically conductive material 31 is electrically coupled to the second current electrode 18 via a first electrically conductive layer 51 and a second electrically conductive layer 52 arranged in an interlayer dielectric 47. The electrically conductive material 31, the first electrically conductive layer 51 and the second electrically conductive layer 52 may include a metal or highly doped polysilicon. The dielectric material 32 at least partially surrounds the electrically conductive material 31. The electrically conductive material 31 extends in a vertical direction from the first electrically conductive layer 51 through a passivation layer 42, the dielectric material 32 and a buffer layer 48 into an electrically conductive substrate 29.

The semiconductor device 50 further includes a metallization layer 49. The metallization layer 49 is arranged on a back-sided surface of the substrate 29 and is electrically coupled to the second current electrode 18 via the electrically conductive substrate 29, the electrically conductive material 31, the first electrically conductive layer 51 and the second electrically conductive layer 52 and provides a backside contact area.

FIGS. 7A to 7F illustrate a method of producing a semiconductor device 60 according to a first embodiment.

An electrically conductive substrate 29 is provided. The substrate 29 may include Si, which may be p-doped or n-doped, or SiGe. A buffer layer 48 is provided on the substrate 29. In the illustrated embodiment, the buffer layer 48 includes AlN. The buffer layer 48 may be provided by metalorganic chemical vapor deposition (MOCVD). FIG. 7A illustrates the semiconductor device 60 after the above-mentioned process steps.

In a further process step, a dielectric material 53 is provided on the buffer layer 48. The dielectric material 53 may include at least one of silicon oxynitride ($SiO_xN_y$), silicon oxide ($SiO_x$), silicon nitride ($Si_3N_4$), and aluminum oxide ($Al_2O_3$). The dielectric material 53 may be provided by low pressure chemical vapor deposition (LPCVD). Additionally, a thermal annealing step may be performed. A structured mask 34 is provided on the dielectric material 53 by applying a structured photolithographic layer on the dielectric material 53. The structured mask 34 includes a plurality of openings 35. In FIG. 7B, two openings 35 are illustrated. However, the structured mask 34 may include more than two openings 35 or may include a single opening 35.

In a further process step, the dielectric material 53 is at least partially removed below the openings 35. In the illustrated embodiment, the dielectric material 53 is removed by etching the dielectric material 53 using a wet-chemical etching process selective to the material of the buffer layer 48, i.e. the etching stops on the buffer layer 48. In a further process step, the structured mask 34 is removed. FIG. 7C illustrates the semiconductor device 60 after the above-mentioned process steps.

Figure 7D:
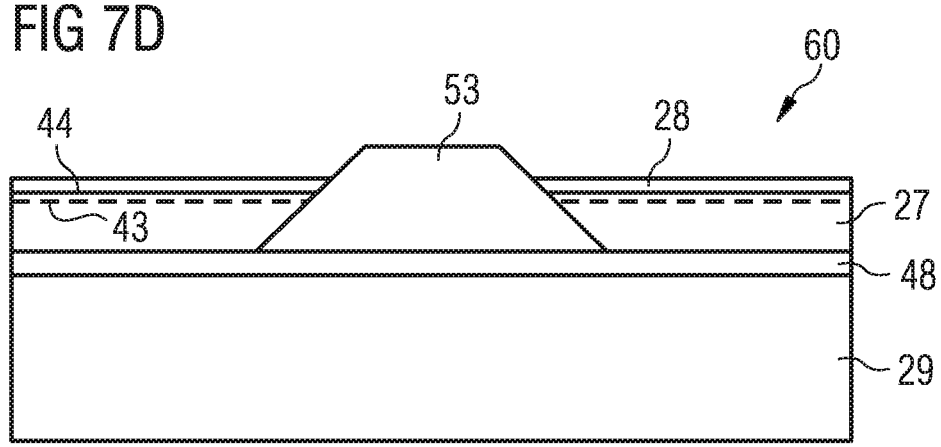

A first compound semiconductor material 27 is then provided on the buffer layer 48. In the illustrated embodiment, the first compound semiconductor material 27 includes unintentionally doped GaN. The first compound semiconductor material 27 may be provided by metalorganic chemical vapor deposition (MOCVD). A second compound semiconductor material 28 is then provided on the first compound semiconductor material 27. In the illustrated embodiment, the second compound semiconductor material 28 includes unintentionally doped AlGaN. The second compound semiconductor material 28 may be provided by metalorganic chemical vapor deposition. FIG. 7D illustrates the semiconductor device 60 after the above-mentioned process steps.

Figure 7E:
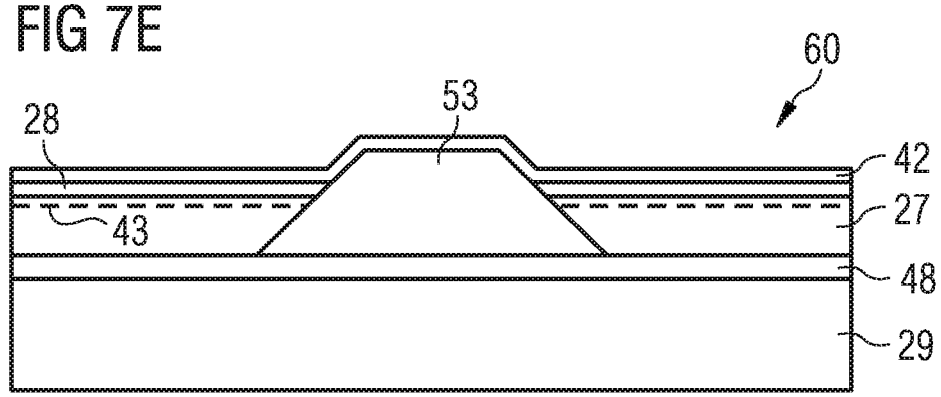

A passivation layer 42 is provided on the second compound semiconductor material 28 and on the dielectric material 53. The passivation layer 42 may be provided by low pressure chemical vapor deposition (LPCVD). In the illustrated embodiment, the passivation layer 42 includes SiN. FIG. 7E illustrates the semiconductor device 60 after the above-mentioned process step.

Figure 7F:
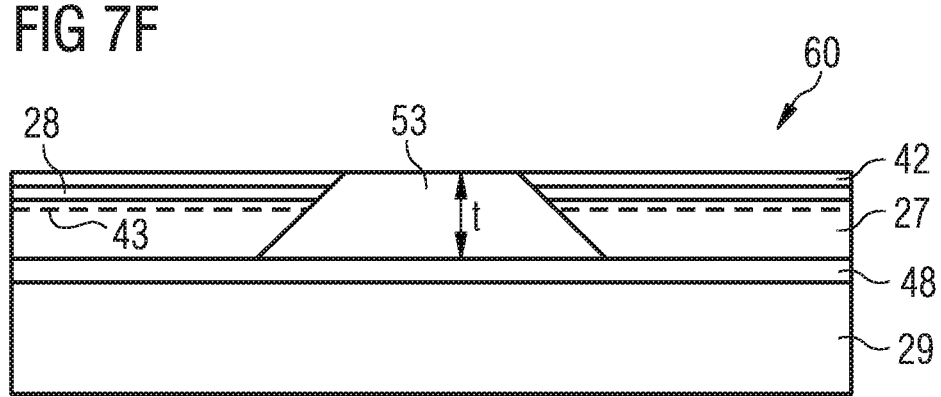

A planarization step is then performed by chemical mechanical planarization (CMP), which is also referred to as chemical mechanical polishing, thereby removing a region of the passivation layer 42 which is arranged on the dielectric material 53 and thinning the dielectric material 53 in order to provide an essentially planer upper surface of the semiconductor device 60. A thickness t of the thinned dielectric material 53 may be in a range of 1 µm≤t≤6 µm. FIG. 7F illustrates the semiconductor device 60 after the above-mentioned process step.

In further process steps, a first current electrode, a second current electrode and a control electrode including an electrically conductive material, for example a metal or highly doped polysilicon, may be provided such that the first current electrode, the second current electrode and the control electrode extend through the passivation layer 42 and directly contact the second compound semiconductor material 28. Moreover, at least one pad including an electrically conductive material, for example a metal or highly doped polysilicon, may be formed on the dielectric material 53 and may be electrically coupled to one of the first current electrode, the second current electrode and the control electrode.

FIGS. 8A to 8D illustrate a method of producing a semiconductor device 70 according to a second embodiment.

An electrically conductive substrate 29 is provided. The substrate 29 may include Si, which may be p-doped or n-doped, or SiGe. A buffer layer 48 is provided on the substrate 29. In the illustrated embodiment, the buffer layer 48 includes AlN. The buffer layer 48 may be provided by metalorganic chemical vapor deposition (MOCVD).

A first compound semiconductor material 27 is then provided on the buffer layer 48. In the illustrated embodiment, the first compound semiconductor material 27 includes unintentionally doped GaN. The first compound semiconductor material 27 may be provided by metalorganic chemical vapor deposition. A second compound semiconductor material 28 is then provided on the first compound semiconductor material 27. In the illustrated embodiment, the second compound semiconductor material 28 includes unintentionally doped AlGaN. The second compound semiconductor material 28 may be provided by metalorganic chemical vapor deposition.

Figure 8A:
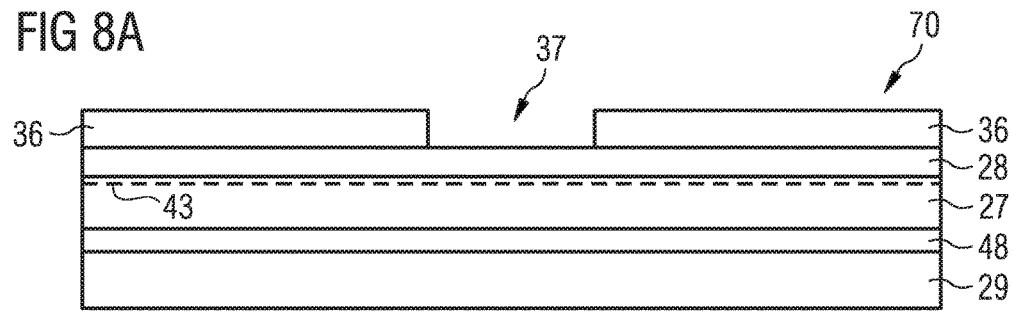
FIGS. 8A to 8D illustrate a method of producing a semiconductor device according to a second embodiment.

In a further process step, a structured mask 36 is provided on the second compound semiconductor material 28 by applying a structured photolithographic layer on the second compound semiconductor material 28. The structured mask 36 includes at least one opening 37. In FIG. 8A, one opening 37 is illustrated. However, the structured mask 36 may include more than one opening 37.

Figure 8B:
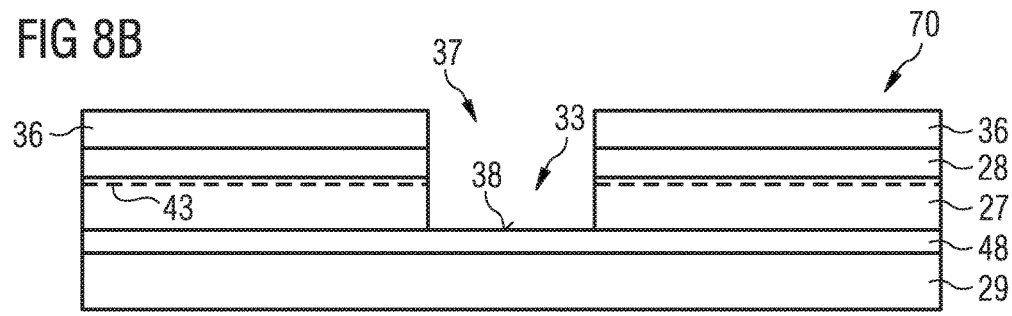
Figure 8C:
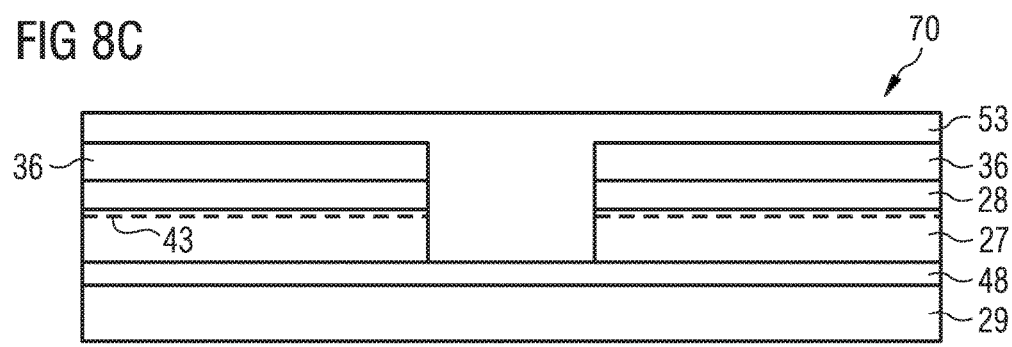

In a further process step, the first compound semiconductor material 27 and the second compound semiconductor material 28 are at least partially removed below the opening 37. In the illustrated embodiment, the first compound semiconductor material 27 and the second compound semiconductor material 28 are removed by etching the first compound semiconductor material 27 and the second compound semiconductor material 28, thereby providing at least one trench 33 extending through the first compound semiconductor material 27 and the second compound semiconductor material 28 to the buffer layer 48. FIG. 8B illustrates the semiconductor device 70 after the above-mentioned process step.

In a further process step, a dielectric material 53 is provided on the buffer layer 48 in the trench 33 and on the structured mask 36, thereby filling the trench 33 with the dielectric material 53. The dielectric material 53 may include at least one of silicon oxynitride ($SiO_xN_y$), silicon oxide ($SiO_x$), silicon nitride ($Si_3N_4$), and aluminum oxide ($Al_2O_3$). The dielectric material 53 may be provided by low pressure chemical vapor deposition (LPCVD).

The depth of the trench 33 illustrated in FIG. 8B is such that the etching process stops on the buffer layer 48, i.e. a base 38 of the trench 33 is provided by an upper surface of the buffer layer 48. However, a removal of the buffer layer 48 below the opening 37 is also possible, i.e. the base 38 of the trench 33 may be provided by an upper surface of the substrate 29. Consequently, the dielectric material 53 may extend to the substrate 29.

Figure 8D:
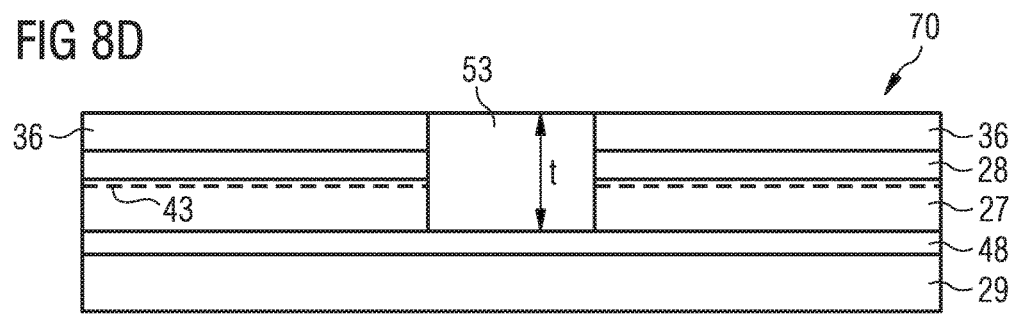

A planarization step is then performed by chemical mechanical planarization (CMP), thereby removing a region of the dielectric material 53 which is arranged on the structured mask 36 and providing an essentially planer upper surface of the semiconductor device 70. A thickness t of the dielectric material 53 after the planarization step may be in a range of 1 µm≤t≤6 µm. FIG. 8D illustrates the semiconductor device 70 after the above-mentioned process step.

In further process steps, the structured mask 36 may be removed and a passivation layer may be applied on the second compound semiconductor material 28 and on the dielectric material 53. Moreover, a first current electrode, a second current electrode and a control electrode including an electrically conductive material, for example a metal or highly doped polysilicon, may be provided such that the first current electrode, the second current electrode and the control electrode extend through the passivation layer and directly contact the second compound semiconductor material 28. Moreover, at least one pad including an electrically conductive material, for example a metal or highly doped polysilicon, may be formed on the dielectric material 53 and may be electrically coupled to one of the first current electrode, the second current electrode and the control electrode.

FIG. 9 illustrates a schematic top view of a semiconductor device 80 according to a sixth embodiment. The semiconductor device 80 includes a first pad 21 electrically coupled to a first current electrode 17 which provides a drain electrode, a second pad 22 electrically coupled to a second current electrode 18 providing a source electrode via an electrically conductive path 39 and a third pad 23 electrically coupled to a control electrode 19 via an electrically conductive path 41. The first current electrode 17, the second current electrode 18, the control electrode 19, the first pad 21, the second pad 22 and the third pad 23 include an electrically conductive material, for example a metal or highly doped polysilicon.

The semiconductor device 80 also includes a further current electrode 18' providing a source electrode of the semiconductor device 50 which is electrically coupled to the second pad 22 via an electrically conductive path 39' and a further control electrode 19' providing a gate electrode of the semiconductor device 50 which is electrically coupled to a fourth pad 23' via the electrically conductive path 41. The current electrode 18' and the control electrode 19' are arranged in the device region 11.

The semiconductor device 80 according to the sixth embodiment differs in that the compound semiconductor layers are provided in only the active device region 11. The non-active device region 13 occupies the entire remainder of the semiconductor device and includes a dielectric material such as $SiO_x$. The interface between the compound semiconductor containing device region 11 and the dielectric containing non-device region 13 is indicated in FIG. 9 with line 81. The pads 21, 22, 23 and 23' are arranged in the non-device area 13 and are surrounded by the dielectric material.

The semiconductor device 80 may be fabricated using the methods illustrated in FIGS. 7 and 8 for example, whereby the compound semiconductor layers are either deposited in only the active region 11 or the compound semiconductor layers are removed in all regions other than the active region 11.

This arrangement may be used to assist in overcoming issues related to mechanical stress, breakage and contamination, for example.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device having a top face and an opposing bottom face, comprising:
    a device region comprising a compound semiconductor material overlying a substrate;
    a non-device region at least partially surrounding the device region;
    a dielectric material in the non-device region;
    a source electrode in the device region;
    a first pad electrically coupled to the source electrode, wherein the first pad is arranged on the dielectric material in the non-device region on the top face of the semiconductor device; and
    an electrically conductive via electrically coupled to the first pad or source electrode and extending vertically from the top face down toward the bottom face, the electrically conductive via extending down to and electrically coupling to the substrate.

2. The semiconductor device of claim 1, wherein the dielectric material comprises a dielectric constant lower than a dielectric constant of the compound semiconductor material.

3. The semiconductor device of claim 1, wherein the dielectric material comprises at least one of silicon oxynitride, silicon oxide, silicon nitride, and aluminum oxide.

4. The semiconductor device of claim 1, wherein a thickness t of the dielectric material in a vertical direction is in a range of 1 µm≤t≤6 µm.

5. The semiconductor device of claim 1, wherein the semiconductor device further comprises a drain electrode, and a control electrode in the device region and wherein the semiconductor device comprises a second pad electrically coupled to the drain electrode and a third pad electrically coupled to the control electrode.

6. The semiconductor device of claim 5, wherein the dielectric material comprises a first dielectric layer, a second dielectric layer and a third dielectric layer, wherein the first pad is arranged on the first dielectric layer, the second pad is arranged on the second dielectric layer and the third pad is arranged on the third dielectric layer.

7. The semiconductor device of claim 1, wherein the compound semiconductor material comprises a first semiconductor material comprising a first bandgap and a second semiconductor material comprising a second bandgap, the second bandgap being different from the first bandgap.

8. The semiconductor device of claim 7, wherein the first semiconductor material comprises GaN.

9. The semiconductor device of claim 7, wherein the second semiconductor material comprises AlGaN.

10. A semiconductor device having a top face and an opposing bottom face, comprising:
a device region comprising a compound semiconductor material overlying a substrate;
a non-device region at least partially surrounding the device region;
a source electrode in the device region;
a first pad electrically coupled to the source electrode;
an electrically conductive material in the device region being electrically coupled to the source electrode or the first pad;
a dielectric material in the non-device region, wherein the dielectric material at least partially surrounds the first pad, and wherein the first pad is arranged on the dielectric material in the non-device region on the top face of the semiconductor device; and
an electrically conductive via electrically coupled to the first pad and extending vertically from the top face down toward the bottom face, the electrically conductive via extending down to and electrically coupling to the substrate.

11. The semiconductor device of claim 10, wherein the first pad comprises a source pad arranged in the non-device region and electrically coupled to the source electrode, wherein the electrically conductive material is electrically coupled to the source pad, thereby electrically connecting the source pad and the substrate.

12. The semiconductor device of claim 10, wherein the dielectric material comprises a dielectric constant lower than a dielectric constant of the compound semiconductor material.

13. The semiconductor device of claim 10, wherein the dielectric material comprises at least one of silicon oxynitride, silicon oxide, silicon nitride, and aluminum oxide.

14. A method of producing a semiconductor device having a top face and an opposing bottom face, comprising:
forming a device region comprising a compound semiconductor material overlying a substrate;
forming a non-device region at least partially surrounding the device region;
providing a dielectric material in the non-device region;
forming a source electrode in the device region;
forming a source pad electrically coupled to the source electrode, wherein the source pad is formed on the dielectric material in the non-device region; and
forming an electrically conductive via that electrically couples to the source pad or the source electrode and extends vertically from the top face down toward the bottom face, the electrically conductive via extending down to and electrically coupling to the substrate.

15. The method of claim 14, wherein providing a dielectric material comprises:
applying the dielectric material on the substrate;
forming a structured mask on the dielectric material, the structured mask comprising at least one opening in the device region;
removing the dielectric material at least partially below the at least one opening; and
removing the structured mask.

16. The method of claim 15, wherein removing the dielectric material comprises etching the dielectric material below the at least one opening.

17. The method of claim 14, wherein providing a dielectric material comprises:
applying the compound semiconductor material on the substrate;
forming a structured mask on the compound semiconductor material, the structured mask comprising at least one opening in the non-device region;
forming a trench in the compound semiconductor material at least partially below the at least one opening;
providing the dielectric material in the trench; and
removing the structured mask.

18. The method of claim 17, wherein forming a trench in the compound semiconductor material comprises etching the compound semiconductor material below the at least one opening.

19. The method of claim 14, further comprising thinning the dielectric material, wherein a thickness t of the thinned dielectric material in a vertical direction is in a range of 1 µm≤t≤6 µm.

20. The method of claim 14, wherein providing a dielectric material comprises applying at least one of silicon oxynitride, silicon oxide, silicon nitride, and aluminum oxide.

* * * * *